(12) United States Patent
Beckmann et al.

(10) Patent No.: US 11,737,286 B2
(45) Date of Patent: Aug. 22, 2023

(54) SELECTOR DEVICES FOR A MEMORY CELL

(71) Applicant: THE RESEARCH FOUNDATION FOR THE STATE UNIVERSITY OF NEW YORK, Albany, NY (US)

(72) Inventors: Karsten Beckmann, Albany, NY (US); Nathaniel Cady, Delmar, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 388 days.

(21) Appl. No.: 16/579,136

(22) Filed: Sep. 23, 2019

(65) Prior Publication Data

US 2020/0161372 A1    May 21, 2020

Related U.S. Application Data

(60) Provisional application No. 62/770,269, filed on Nov. 21, 2018.

(51) Int. Cl.
*H10B 63/00*     (2023.01)
*H10N 70/00*     (2023.01)

(52) U.S. Cl.
CPC ........... *H10B 63/22* (2023.02); *H10N 70/041* (2023.02); *H10N 70/841* (2023.02); *H10N 70/8833* (2023.02)

(58) Field of Classification Search
CPC ............. H01L 27/2418; H01L 45/1253; H01L 45/146; H01L 45/1641; H01L 45/1233;
(Continued)

(56) References Cited

U.S. PATENT DOCUMENTS 7,772,581 B2    8/2010   Lung
8,772,750 B2    7/2014   Lee et al.
(Continued)

FOREIGN PATENT DOCUMENTS

WO     2020/131179 A3    6/2020

OTHER PUBLICATIONS

International Search Report and Written Opinion of the International Searching Authority for PCT/US2019/052339, dated Jun. 4, 2020, 10 pages.

*Primary Examiner* — Wasiul Haider
(74) *Attorney, Agent, or Firm* — Lance D. Reich; Peter Fallon; Austin Winter

(57) ABSTRACT

A selector device includes a first electrode composed of a first metal having a first work function. A second electrode is composed of a second metal having a second work function. A selector layer is disposed between the first and second electrodes and is composed of a dielectric material having a conduction band and a valence band defining a band gap of at least 5 electron volts. Dopant atoms are disposed in the selector layer to form a sub-conduction band that is below the conduction band and above the work functions. When a threshold voltage is applied across the first and second electrodes, and a magnitude of the threshold voltage exceeds an energy difference between the sub-conduction band and the work functions, but does not exceed an energy difference between the conduction band and the work functions, an on-current will conduct through the selector layer.

19 Claims, 8 Drawing Sheets

(58) Field of Classification Search
CPC ..... H01L 27/2409; H10B 63/22; H10B 63/80; H10N 70/041; H10N 70/841; H10N 70/8833; H10N 70/00; H10N 70/063; H10N 70/24; H10N 70/826
See application file for complete search history.

(56) References Cited

U.S. PATENT DOCUMENTS

| | | |
|---|---|---|
| 2009/0072348 A1 | 3/2009 | Klostermann et al. |
| 2013/0062587 A1* | 3/2013 | Lee .................. H01L 45/08 257/4 |
| 2017/0025605 A1* | 1/2017 | Park .................. H01L 45/149 |
| 2017/0365780 A1 | 12/2017 | Narayanan et al. |
| 2018/0375021 A1* | 12/2018 | Wang ................. H01L 27/2472 |
| 2020/0006432 A1* | 1/2020 | Grobis ................ H10N 50/01 |
| 2020/0185457 A1* | 6/2020 | Sharma ............... H10N 70/021 |

* cited by examiner

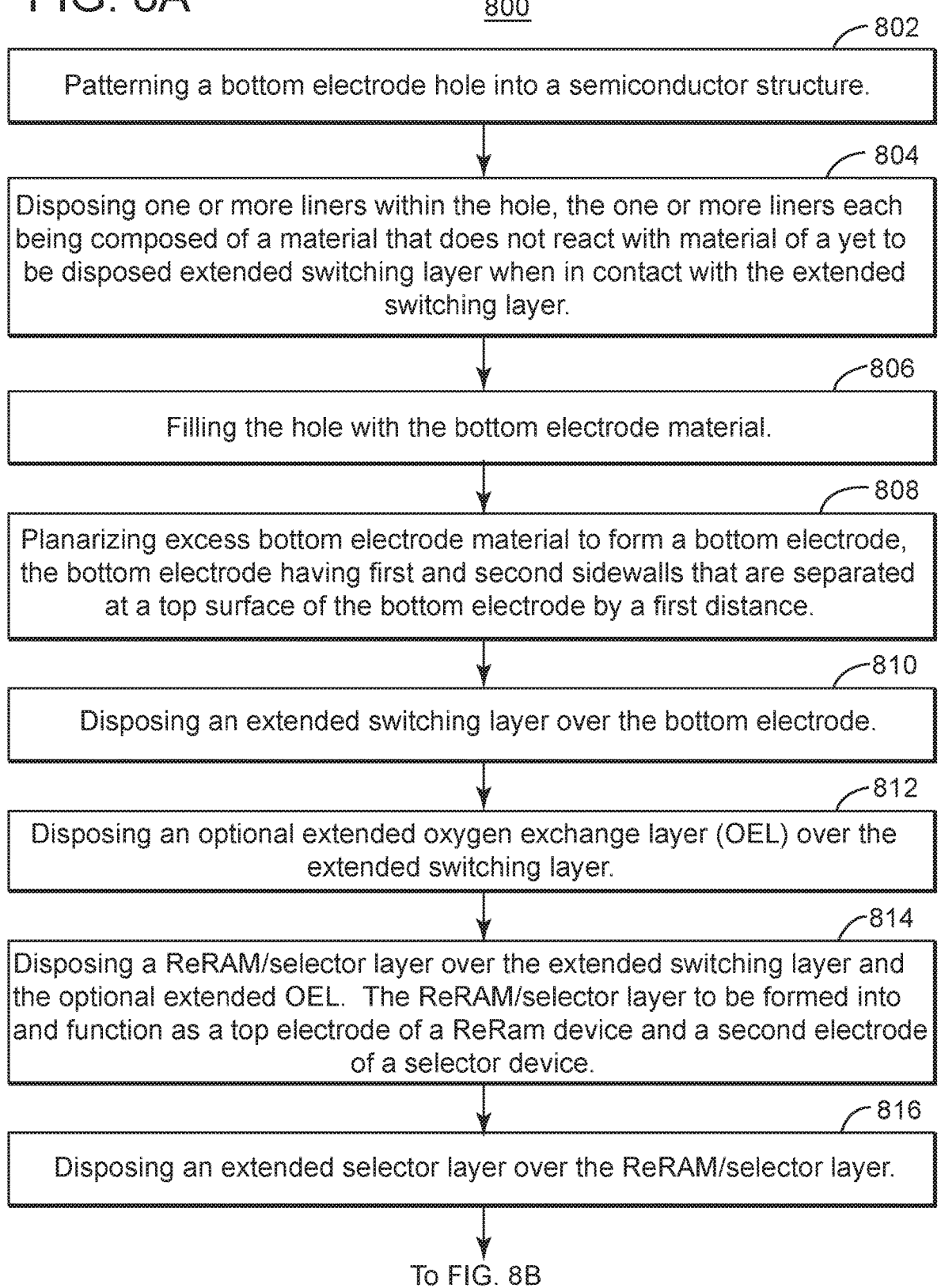

SELECTOR DEVICES FOR A MEMORY CELL

GOVERNMENT RIGHTS STATEMENT

This invention was made with U.S. Government support under Agreement Nos. FA8750-11-1-0008 and FA8750-16-1-0063 awarded by the Air Force Research Labs to the SUNY Research Foundation for the State University of New York. The Government has certain rights in the invention.

TECHNICAL FIELD

The present disclosure relates to selector devices for a memory cell and methods of making the same. More specifically, the disclosure relates to metal-insulator-metal selector devices for two terminal resistive switching memory cells and methods of making the same.

BACKGROUND

Two terminal resistive switching memory devices (herein resistive memory devices), such as resistive random access memory (ReRAM) devices, phase change memory (PCM) devices, conductive bridge random access memory (CBRAM) devices or the like, show great promise as enablers of neuromorphic computer systems. Much like a synapse in a human brain, several types of resistive memory devices can function, not only as a digital non-volatile memory switching device, but also as an analog memory device, wherein their characteristics can be changed by varying certain parameters controlling the resistive memory devices. Accordingly, resistive memory devices can emulate a synapse in a human brain more closely than previous devices.

The brain processes information through a large network of synapses. Electrical impulses representing that information enter the synapses. The impulses stimulate a chemical signal across a boundary (or synaptic junction) of the synapses. The amount of chemical signal that gets released, and the amount of receptors that pick up the chemical signal is how the brain provides an analog-like weighted output based on the information being received.

By way of an example of a resistive memory device that can emulate a synapse, a ReRAM device can provide an analog-like weighted output similar to that of a synapse. The ReRAM is a type of non-volatile random-access computer memory that works by changing the resistance across a dielectric solid-state material (or insulator). The ReRAM involves generating defects in a thin dielectric oxide layer, known as filaments. The filaments include oxygen vacancies (locations where the oxygen has been removed), which can subsequently charge and drift under an electric field and thermal energy.

A selector device may be paired with a ReRAM device (as well as other resistive memory devices) to form a memory cell. The memory cells can be utilized in ultra-dense memory arrays, wherein the selector devices are utilized to select a single ReRAM device out of the millions that may be in such an array. Such arrays may be functionally analogous to the network of synapses in a human brain.

Problematically however, prior art selector devices do not scale with ReRAM devices to achieve the required current densities of tens of mega amps per centimeter squared ($MA/cm^2$), i.e. diodes. Other selector implementations are based on 3 terminal devices such as transistors which have a considerably larger footprint. Additionally, some selector devices, such as phase-change selector devices, may contain high contents of arsenic, a hazardous material that makes them expensive to produce. Moreover, prior art selector devices can consume too much power and may have problems in scaling.

Additionally, prior art selector devices leave room for improvement when compared to the functional characteristics of an ideal selector device. Basically, an ideal selector device functions as an ideal switch, wherein the selector device has an infinite ratio of on-current (Ion) to off-current (Ioff) and can switch from an on-state to an off-state infinitely fast (i.e., in zero time).

Accordingly, there is a need for a selector device with characteristics that approach the characteristic of an ideal switch more closely than prior art selector devices. Also, there is a need for such selector devices to be scaled down as much as possible and to consume as little power as possible. Further there is a need to manufacture selector devices in a more cost-effective manner.

BRIEF DESCRIPTION

The present disclosure offers advantages and alternatives over the prior art by providing a selector device that has a first electrode and a second electrode with a selector layer disposed therebetween. The first electrode is composed of a first metal having a first work function. The second electrode is composed of a second metal that has a second work function. The selector layer has a conduction band and a valence band that defines a band gap of at least 5.0 electron volts. Dopant atoms are disposed within the selector layer to form a sub-conduction band that is below the conduction band of the selector layer and above the work functions of the electrodes. The selector device may have ratios of on-current to off-current that are equal to or greater than 1000, equal to or greater than 10,000, equal to or greater than 100,000 or more.

A selector device in accordance with one or more aspects of the present disclosure includes a first electrode composed of a first metal having a first work function. A second electrode is composed of a second metal having a second work function. A selector layer is disposed between the first and second electrodes. The selector layer is composed of a dielectric material having a conduction band and a valence band defining a band gap of at least 5 electron volts. Dopant atoms are disposed in the selector layer to form a sub-conduction band that is below the conduction band and above the first and second work functions. When a threshold voltage is applied across the first and second electrodes, and a magnitude of the threshold voltage exceeds an energy difference between the sub-conduction band and at least one of the work functions, but does not exceed an energy difference between the conduction band and the at least one of the work functions, than an on-current will conduct through the selector layer.

A memory cell in accordance with one or more aspects of the present disclosure includes a selector device disposed on a two terminal resistive switching device. The selector device includes a first electrode composed of a first metal having a first work function. A second electrode is composed of a second metal having a second work function. A selector layer is disposed between the first and second electrodes. The selector layer is composed of a dielectric material having a conduction band and a valence band defining a band gap of at least 5 electron volts. Dopant atoms are disposed in the selector layer to form a sub-conduction band that is below the conduction band and above the first and second work functions. When a threshold voltage that exceeds an energy difference between the sub-conduction band and at least one of the work functions, but does not exceed an energy difference between the conduction band and the at least one of the work functions, is applied across the first and second electrodes, than an on-current will conduct through the selector layer.

A method of forming a memory cell in accordance with one or more aspects of the present disclosure includes a bottom electrode hole patterned into a semiconductor structure. The hole is filled with bottom electrode material. Excess bottom electrode material is planarized to form a bottom electrode. The bottom electrode has first and second sidewalls that are separated at a top surface of the bottom electrode by a first distance. An extended switching layer is disposed over the bottom electrode. A ReRAM/selector layer is disposed over the extended switching layer. The ReRAM/selector layer has a second work function. An extended selector layer is disposed over the ReRAM/selector layer. The extended selector layer has a conduction band and a valence band defining a band-gap of at least 5.0 electron volts. A concentration of dopant atoms is distributed within the extended selector layer to form a sub-conduction band within the extended selector layer that is below the conduction band and above the second work function. A first electrode layer is disposed over the extended selector layer. The first electrode layer has a first work function that is below the sub-conduction band. The extended switching layer, the ReRAM/selector layer, the extended selector layer, and the first electrode layer are lithographically patterned to form a switching layer, a top electrode for a ReRAM device, a second electrode for a selector device, a selector layer and a first electrode.

DRAWINGS

The disclosure will be more fully understood from the following detailed description taken in conjunction with the accompanying drawings, in which:

FIG. 8A depicts an example of a first portion of a process flow diagram of a method of making a memory cell according to aspects described herein.

DETAILED DESCRIPTION

Certain examples will now be described to provide an overall understanding of the principles of the structure, function, manufacture, and use of the methods, systems, and devices disclosed herein. One or more examples are illustrated in the accompanying drawings. Those skilled in the art will understand that the methods, systems, and devices specifically described herein and illustrated in the accompanying drawings are non-limiting examples and that the scope of the present disclosure is defined solely by the claims. The features illustrated or described in connection with one example may be combined with the features of other examples. Such modifications and variations are intended to be included within the scope of the present disclosure.

The terms "substantially", "approximately", "about", "relatively," or other such similar terms that may be used throughout this disclosure, including the claims, are used to describe and account for small fluctuations, such as due to variations in processing from a reference or parameter. Such small fluctuations include a zero fluctuation from the reference or parameter as well. For example, they can refer to less than or equal to ±10%, such as less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Figure 1A:
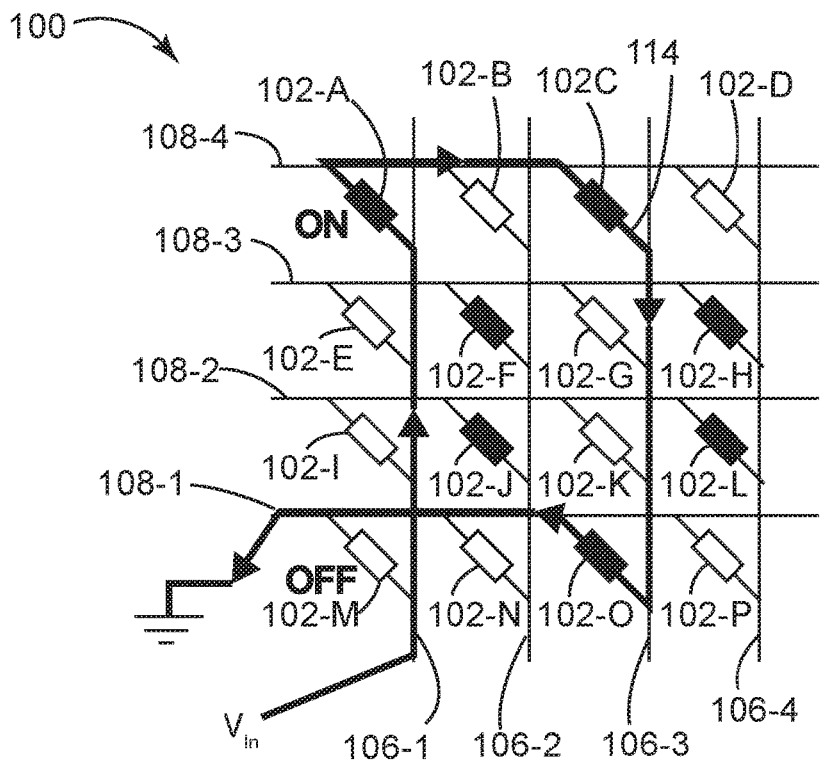
FIG. 1A depicts an example of schematic diagram of a crossbar array of memory cells in accordance with aspects described herein.
Figure 1B:
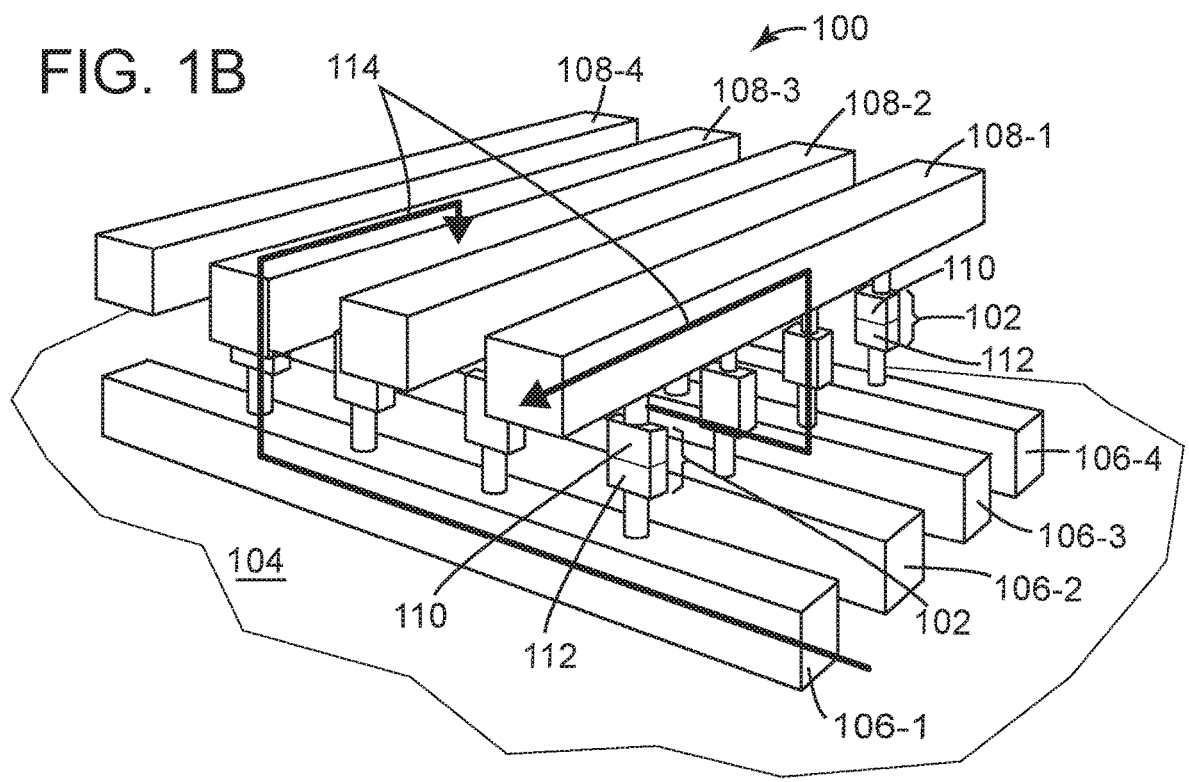
FIG. 1B depicts an example of a perspective view of the crossbar array of FIG. 1A in accordance with aspects described herein.

Referring to FIGS. 1A and 1B, a schematic diagram (FIG. 1A) and a perspective view (FIG. 1B) of an example of a crossbar array 100 of memory cells 102 disposed in a semiconductor structure 104 is depicted in accordance with aspects described herein. The crossbar array 100 includes a plurality of parallel first interconnect lines 106 disposed in the semiconductor structure 104 at a lower level. The array 100 also includes a plurality of parallel second interconnect lines 108 disposed in the semiconductor structure 104 at an upper level. The first and second interconnect lines 106, 108 are oriented at right angles to each other to form an array 100 of crossbars (i.e., each first interconnect line 106 crosses a plurality of second interconnect lines 108 and vice versa).

At each point in the array 100, where the first and second interconnect lines 106, 108 cross, a memory cell 102 is disposed in electrical contact between the first interconnect line 106 and the second interconnect line 108 to form a node in the array 100. Each memory cell 102 includes a selector device 110 in series electrical contact with a two terminal resistive switching memory device (i.e., resistive memory device) 112.

In this particular example, each resistive memory device 112 is a ReRAM device. However, other types of resistive memory devices may also be used, for example, the resistive memory device 112 may be PCM, CBRAM or the like.

Each ReRAM device 112 in each memory cell 102 has at least an "on-state" (represented as the shaded memory cells 102 in FIG. 1A) and an "off-state" (represented as the unshaded memory cells 102 in FIG. 1A). In the on-state, a ReRAM device 112 has a low resistance and is conductive. In the off state, a ReRAM device 112 has a high resistance and is not conductive.

The state of each ReRAM device 112 can be determined by probing the first and second interconnect lines 106, 108 that form the node that the memory cell 102 is located in. Additionally, the state of each ReRAM device 112 can be switched from its on-state to its off-state (and vice versa) by applying an operating voltage (Vop) of the ReRAM device 112 across the same interconnect lines 106, 108. To facilitate such probing and switching techniques, the first and second interconnect lines 106, 108 may be assigned coordinates in an X-Y coordinate system as illustrated in FIG. 1A so that the memory cells 102 can be located by the intersection of those coordinates.

In the particular example of FIG. 1A, a total of four of the first interconnect lines 106 are assigned X coordinates 106-1 through 106-4 and are represented by the vertical lines in FIG. 1A. Additionally, a total of four of the second interconnect lines 108 are assigned Y coordinates 108-1 through 108-4 and are represented by the horizontal lines in FIG. 1A. For purposes of clarity, the memory cells 102 are assigned letters 102A through 102P respectively in FIG. 1A. Accordingly, memory cell 102M would have coordinates 106-1, 108-1 and would be located in the lower left-most corner of the array 100. Also, the memory cell 102D would have coordinates 106-4, 108-4 and would be located in the upper right most corner of the array 100.

Though the array 100 in this example is illustrated as having four first interconnect lines 106 and four second interconnect lines 108, the array may have any number of first and second interconnect lines 106, 108. Additionally, the X-Y coordinate system used to locate each memory cell 102 may include any number of X and Y coordinates to match the size of the array 100.

Problematically, if the memory cells 102 did not include a selector device 110, then the state of a ReRAM device 112 may be masked, or may not be able to be switched, due to additional conductive paths (known as "sneak paths") 114 that can randomly occur within the array 100. For example, the ReRAM device 112 of memory cell 102M is illustrated in FIG. 1A as being in its off-state and should read a high resistance when probed along coordinates 106-1,108-1. However, there is an additional sneak path 114 through the on ReRAM devices 112 in memory cells 102A, 102C and 102D, which is connected in parallel with memory cell 102M. Therefore, when probing first and second interconnect lines 106-1 and 108-1, instead of reading that the memory cell 102M is in a high resistive off-state, the probes will incorrectly indicate that the memory cell 102M is in a low resistive on-state, because of the low resistance measured across the on ReRAMs of memory cells 102A, C and D.

Any sneak path 114 can include no fewer than three memory cells 102 in order to be randomly connected in parallel across any pair of first and second interconnect lines 106, 108 that are being probed. By way of example, the sneak path 114 of FIGS. 1A and 1B must be connected in parallel across the pair of probed first and second interconnect lines 106-1 and 108-1. To do this, the sneak path 114 must initially extend along the probed first interconnect line 106-1, then up through a first memory cell 102A, then along a second interconnect line 108-4, then down through a second memory cell 102C, then along another first interconnect line 106-3, then up through a third memory cell 102O, and finally along the probed second interconnect line 108-1.

It is mathematically impossible to have fewer than three memory cells 102 in any one sneak path 114 within the structure of a crossbar array 100. There may be more than three memory cells 102 in a single sneak path and there can be several sneak paths, but there cannot be less than three memory cells 102 per sneak path in this crossbar structure.

Any operating voltage (Vop), used to set and reset a ReRAM device 112 within a memory cell 102, will also be distributed across each sneak path 114 that is connected in parallel across that ReRAM device. Accordingly, the voltage distributed across each memory cell 102 in a sneak path may be, at most, about one third of Vop (or Vop/3). The voltage drop across the memory cells 102 in a sneak path 114 may be less than Vop/3 if there are more than three memory cells in the sneak path, but the voltage drop cannot be significantly more than Vop/3.

The selector devices 110 in each memory cell 102 are utilized to prevent such sneak paths from obscuring the reading of, or preventing the switching of, a ReRAM device 112 within a memory cell 102 being probed or switched. Therefore, a selector device 110 in a memory cell 102 should have a threshold-on voltage (Vth) (which activates the selector device 110) that is less than the Vop (which operates and/or switches the associated ReRAM device 112). Additionally, the same selector device 110 should have a threshold-off voltage (usually set at half the threshold voltage (Vth/2)) that is greater than or equal to Vop/3 in order to prevent any sneak path 114 from obscuring the selection, or preventing the switching, of its memory cell 102.

By way of example, if the operating voltage (Vop) for each ReRAM device 112 of each memory cell 102 in array 100 is plus or minus 1.5 volts, then for any sneak path 114, the magnitude of the voltage drop across the memory cells 102 in that sneak path will be a maximum of 0.5 volts (Vop/3). As such, it would be desirable for the selector devices 110 associated with each memory cell 102 in the array 100 to have a threshold-on voltage (Vth) of less than 1.5 volts (for example Vth could be 1.2 volts). Additionally, it would be desirable to have the threshold-off voltage (Vth/2) to be greater than or equal to Vop/3. In this case, Vth/2is 0.6 volts, which is greater than the Vop/3 of 0.5 volts.

Figure 2:
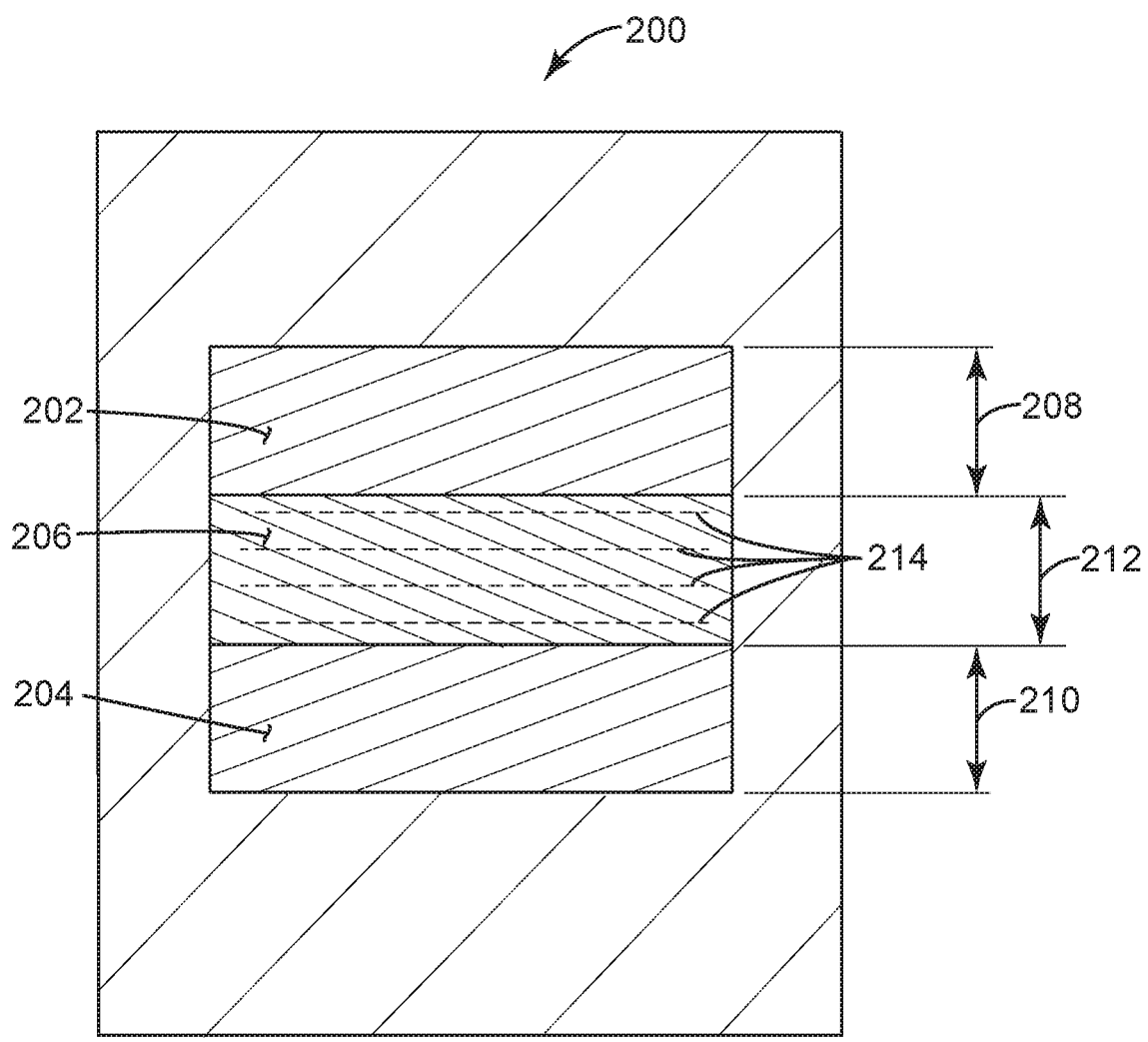
FIG. 2 depicts an example of a side view of a selector device in accordance with aspects described herein.

Referring to FIG. 2, an example of a side view of a selector device 200 that may be used in the crossbar array 100 of FIGS. 1A and 1B in accordance with aspects disclosed herein is presented. The selector device 200 may advantageously more closely approach the characteristics of an ideal switch than other prior art selector devices. Also, the selector device 200 may be more scalable and consume less power than other prior art selector devices. Additionally, the selector device 200 may be manufactured without hazardous materials, using established techniques and tooling. Moreover, the selector device 200 can be paired with a resistive memory device (such as ReRAM device 112), such that the Vth of the selector device is less than the Vop of the ReRAM device and the Vth/2of the selector device is greater than or equal to the Vop/3 of the ReRAM device.

The selector device 200 includes a first electrode 202 and a second electrode 204 with a selector layer 206 disposed therebetween. The first electrode 202 may be composed of a first metal having a first work function 508 (best seen in FIG. 5A). The second electrode 204 may be composed of a second metal having a second work function 510 (best seen in FIG. 5A). The first electrode 202 may have a first thickness 208 and the second electrode 204 may have a second thickness 210, both of which may be within a range of 5 to 200 nanometers thick, depending on design parameters.

The first and second metals of the first and second electrodes 202, 204 may be the same metal or different metals depending on design parameters. The first and second metals may be such metals as tungsten, platinum, iridium, titanium nitride, tantalum nitride or the like. Though the example in FIG. 2 illustrates the first and second electrodes 202, 204 as being composed of a single metal, the electrodes 202, 204 may also be composed of a plurality of metals.

Work function, as defined herein, is the minimum thermodynamic work (i.e. energy) needed to remove an electron from a solid to a point in a vacuum immediately outside the solid surface. Work function is often expressed in electron volts (eV).

The first and second work functions 508, 510 of the first and second electrodes 202, 204 may also be the same work function or different functions, again depending on design parameters. The first and second work functions 508, 510 may be above 4 eV.

Figure 5A:
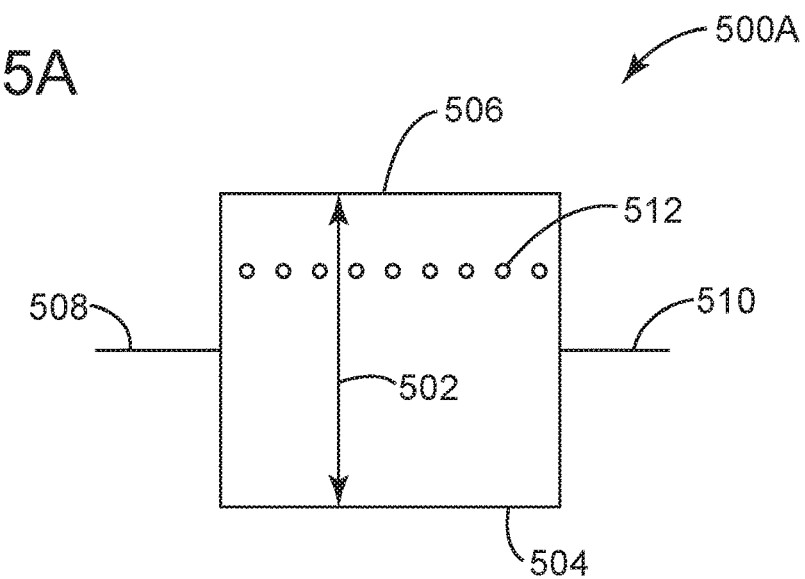
FIG. 5A depicts an example of a band-gap diagram of the selector device of FIG. 2 having no voltage applied across first and second electrodes of the selector device in accordance with aspects described herein.

The selector layer 206 may be composed of a dielectric material having a relatively large band gap 502 (best seen in FIG. 5A). That is, the selector layer 206 should have a band gap of at least 5.0 eV. More preferably, the band gap of the selector layer should be at least 7.0 eV.

The band gap 502, as defined herein, is the energy difference (in electron volts (eV)) between the top of the valence band 504 and the bottom of the conduction band 506 (best seen in FIG. 5A) in dielectric and semiconductor materials. It is the energy required to promote a valence electron in the outer-most electron orbital of an atom (i.e., the top of the valence band) to become a conduction electron in the conduction band.

In non-metals, the valence band and conduction band are the bands (or ranges) of electron energy states that are fully or partially occupied, respectively. The valence band is the highest range of electron energy states in which electrons are normally present at absolute zero. The conduction band is the lowest range of electron energy states that contribute to conduction. In the conduction band electrons are normally vacant at absolute zero. When electrons are in the conduction band, they are delocalized from the atom and are subject to drift and diffusion. The band gap of a non-metal is the difference between the top of the valence band and the bottom of the conduction band. In metals, there is no band gap because the conduction and valence bands overlap.

The selector layer 206 in this particular example of FIG. 2 is aluminum oxide ($Al_2O_3$). However, the selector layer 206 may be composed of other metal oxides as well, such as silicon oxide or magnesium oxide. The band gap of each of those materials is approximately 8.0 eV or greater. More specifically, the band gap of aluminum oxide is approximately 8.6 eV, the band gap of silicon oxide is approximately 9.2 eV and the band gap of magnesium oxide is approximately 8.0 eV.

The selector layer 206 is usually (though not always) thin compared to the first and second electrodes 202, 204. More specifically, the selector layer 206 may have a thickness 212 that is within a range of 2 to 20 nanometers thick.

The selector layer 206 also includes a concentration of dopant atoms 214 that are disposed in the selector layer 206 to form a sub-conduction band 512 (best seen in FIG. 5A). The sub-conduction band 512 represents an energy level (or energy barrier) that electrons from the first and second electrodes 202, 204 can be thermodynamically energized to, whereupon the electrons will then be energized enough to conduct from dopant atom to dopant atom within the selector layer 206. The sub-conduction band 512 (often expressed in electron volts (eV)) is located below the conduction band 506 and above the first and second work functions 508, 512. For example, the sub-conduction band 512 may be in a range of 0.2 to 1.5 eV above the work function of one of the electrodes 508, 510.

In this particular example in FIG. 2, the dopant atoms are titanium (Ti) atoms. However, other dopant atoms may also be used. For example, the dopant atoms may be magnesium, vanadium or the like.

The dopant atoms 214 may be spatially distributed within the selector layer 206 with a fairly uniform concentration. For example, the dopant atoms 214 may be spatially distributed within the selector layer 206 in a concentration of approximately one times ten to the $19^{th}$ power per cubic centimeter (1.0E19 $cm^{-3}$). Also for example, the concentration of dopant atoms 214 may be spatially distributed within a range of $10^{18}$ $cm^{-3}$ to $5 \times 10^{21}$ $cm^{-3}$.

The spatial distribution of dopant atoms 214 within the selector layer 206 can be accomplished by utilizing a variety of techniques. For example, the dopant atoms 214 may be doped via implantation, diffusion, sputtering or the like. Alternatively, the dopant atoms may be doped in-situ using chemical vapor deposition (CVD) techniques or physical vapor deposition (PVD) techniques. Additionally, atomic layer deposition (ALD) techniques may be utilized to interlay layers or mix the precursors of the dielectric material (such as $Al_2O_3$) of the selector layer 206 with layers of the dopant atoms 214 (such as Ti) and then anneal the layers to evenly diffuse the dopant atoms 214 throughout the selector layer 206.

The proper spatial distribution of the select dopant atoms 214 dispersed throughout the wide band gap dielectric material of the selector layer 206 form the sub-conduction band 512. The sub-conduction band 512 has an energy level that is significantly below the conduction band 506 and above either of the work functions 508, 510 of the first and second electrodes 202, 204. Accordingly, if a threshold voltage (Vth) is applied across the first and second electrodes 202, 204 such that a magnitude of the threshold voltage Vth exceeds an energy difference between the sub-conduction band 512 and at least one of the work functions 508, 510, but does not exceed an energy difference between the conduction band 506 and the at least one of the work functions 508, 510, an on-current (Ion) (best seen in FIG. 4) will conduct through the selector layer 206.

In other words, if a threshold voltage of Vth is applied across the electrodes 202, 204 that is higher than the sub-conduction band 512, but lower than the conduction band 506, then electrons in the electrode will be energized enough to overcome the sub-conduction band barrier but not energized enough to overcome the conduction band barrier. As such, the electrons will conduct from one dopant atom to another dopant atom by one of several well-known conduction mechanisms. Such well-known conduction mechanisms may include a trap-assisted tunneling (TAT) mechanism, a hopping conduction mechanism, a Fowler-Nordheim tunneling mechanism, a direct tunneling mechanism, a direct sub-band drift transport mechanism or the like.

Figure 3:
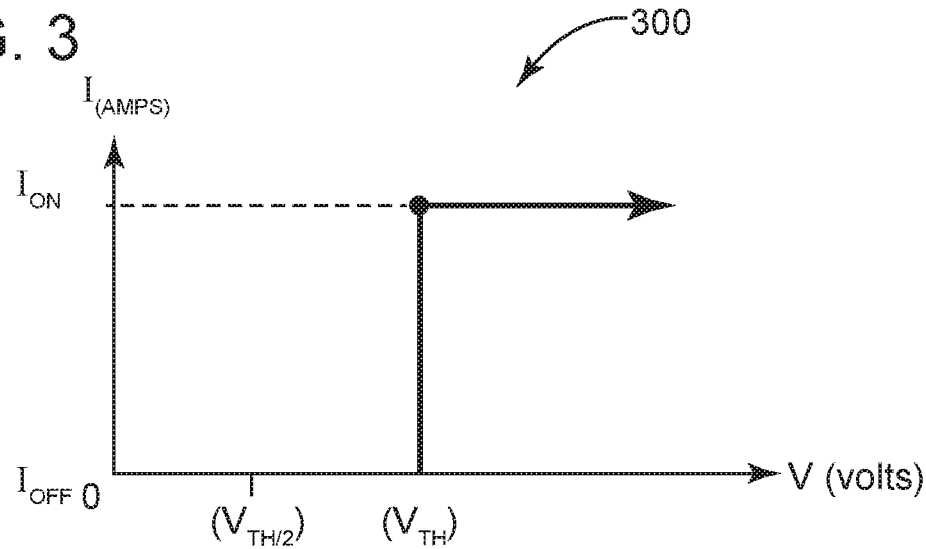
FIG. 3 depicts an example of a linear graph of voltage (V) vs. current (I) of a theoretically ideal selector device in accordance with aspects described herein.

Referring to FIG. 3 an example of a linear graph 300 of voltage (V) vs. current (I) of a theoretically ideal selector device in accordance with aspects described herein is presented. In the graph 300, both the voltage (in volts) and the current (in amps) are plotted on a linear scale. An ideal selector device theoretically has an off-current (Ioff) of zero up to the threshold voltage (Vth) of the selector device. At Vth, there is a perfectly vertical step change as the Ioff instantaneously transitions to the full on-current (Ion). As such, the ratio of Ion to Ioff is infinite.

Figure 4:
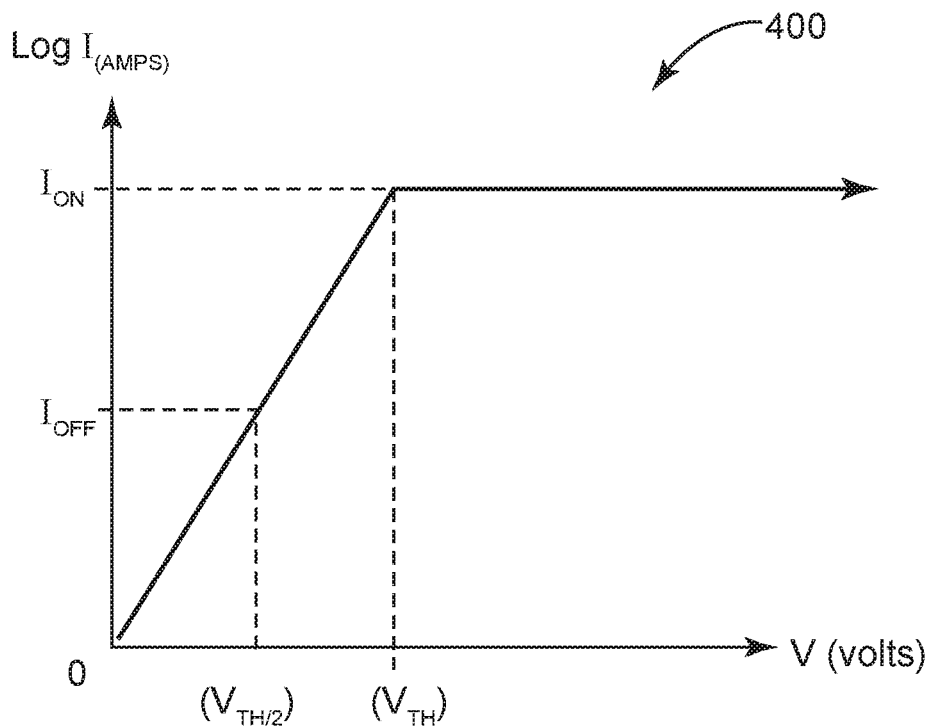
FIG. 4 depicts an example of a semi-log graph of voltage (V) vs. current (I) of the selector device of FIG. 2 in accordance with aspects described herein.

Referring to FIG. 4, an example of a semi-log graph 400 of voltage (V) vs. current (I) of the selector device 200 of FIG. 2 in accordance with aspects described herein is presented. In graph 400, the voltage (in volts) is plotted on a linear scale and the current (in amps) is plotted on a logarithmic scale.

For this example of the current vs. voltage characteristics of selector device 200, the off-current (Ioff) is defined as the current at the half threshold voltage point (Vth/2). Additionally, the on-current (Ion) is defined as the current at the full threshold voltage point (Vth).

As will be explained in greater detail herein, the current vs. voltage characteristics of selector device 200 may approach that of an ideal selector device in that the current rises exponentially from Ioff to Ion and may be many decades in magnitude apart. More specifically, the ratio of Ion to Ioff may be equal to or greater than 1000, equal to or greater than 10,000, equal to or greater than 100,000 or more.

As a crossbar memory array grows in size, a large ratio of Ion to Ioff becomes increasingly important. This is due to the increasing number of unwanted, but unavoidable, sneak paths that may be formed in parallel with any memory device in the array as the array increases in size.

More specifically, because a selector device is not ideal, that selector device will draw some small amount of current when Vth/2 is applied. However, each sneak path in parallel with that selector device will also have Vth/2 applied across it and will also draw a small amount of current. As the array grows, the number of sneak paths that can statistically form in parallel with that selector device will also grow, and so will the total current that they will draw. If the number of sneak paths is too large, the current they draw will approach the on-current (Ion), even at the Vth/2 point where only Ioff is supposed to flow.

Accordingly, the size of the ratio of Ion to Ioff for any set of selector devices is a primary limiting factor in how large an array can be made out of those selector devices. For very large arrays, a ratio of Ion to Ioff of preferably at least 1000, and more preferably at least 10,000, may be desirable. Such large Ion to Ioff ratios can be achieved with selector device 200, whereas many prior art selector devices would have trouble achieving such high Ion to Ioff ratios.

Figure 5B:
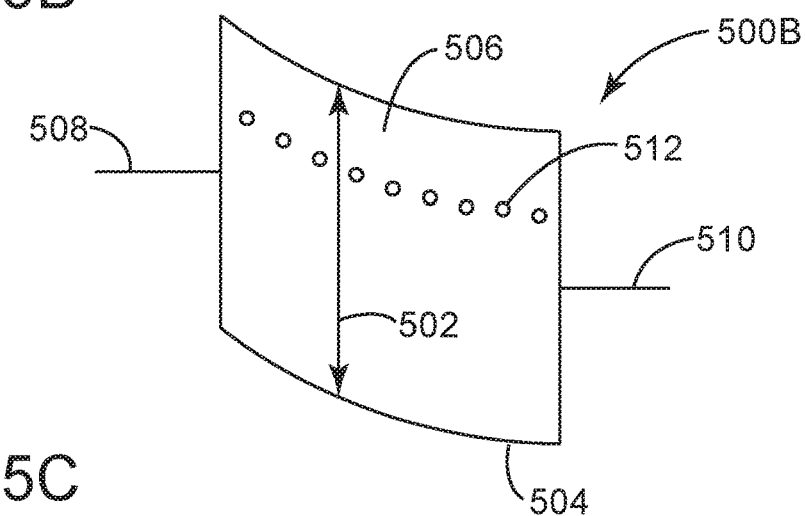
FIG. 5B depicts an example of a band-gap diagram of the selector device of FIG. 2 having a half threshold voltage applied across first and second electrodes of the selector device in accordance with aspects described herein.
Figure 5C:
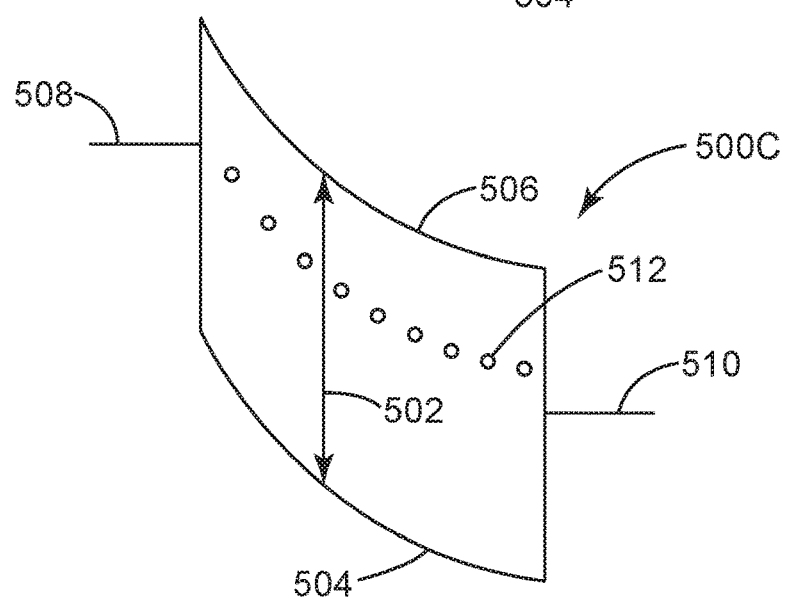
FIG. 5C depicts an example of a band-gap diagram of the selector device of FIG. 2 having a full threshold voltage applied across first and second electrodes of the selector device in accordance with aspects described herein.

Referring to FIGS. 5A, 5B and 5C, an example of a band-gap diagram of the selector device 200 under various applied voltages (or electric fields) is presented in accordance with aspects described herein. In FIG. 5A, no voltage is applied across the first and second electrode 202, 204 of selector device 200. In FIG. 5B, a half threshold voltage (Vth/2) is applied across the first and second electrodes 202, 204 of selector device 200. Finally, in FIG. 5C, a full threshold voltage (Vth) is applied across the first and second electrodes 202, 204 of selector device 200.

In each of the band-gap diagrams 500A, 500B and 500C, the band gap 502 is defined as the difference between the valence band energy level 504 and the conduction band energy level 506 of the selector layer 206. The first work function 508 of the first electrode 202 is represented on a first side of the band-gap 502. The second work function 510 of the second electrode 204 is represented on a second opposing side of the band-gap 502. Both the first and second work functions 508, 510 are located between the valence band 504 and conduction band 506. The sub-conduction band 512 is located above the first and second work functions 508, 510 and below the conduction band 506.

Referring more specifically to FIG. 5A, when zero voltage is applied across the first and second electrodes 202, 204, the electrons in the electrodes will not have enough energy to overcome the energy barriers between the first and second work functions 508, 510 and the sub-conduction band 512. Accordingly, substantially no current will flow through the selector layer 206 of the selector device 200.

Referring specifically to FIG. 5B, a half threshold voltage (Vth/2) is applied across the first and second electrodes 202, 204. In this particular example the polarity of the applied voltage is such that the first electrode 202 is more negative relative to the second electrode 204. As such, the band-gap 502 begins to bend as the energy level of the first work function 508 is elevated closer to the sub-conduction band 512.

Accordingly, electrons from the first electrode 202 may be energized to overcome the energy barrier between the first work function 508 and the sub-conduction band 512 to establish an off-current (Ioff) through the selector layer 206. The conduction mechanism causing the Ioff may be a trap assisted tunneling current through the sub-conduction band, but not much more.

Referring more specifically to FIG. 5C, a full threshold voltage (Vth) is applied across the first and second electrodes 202, 204. When Vth is applied, the magnitude of the Vth exceeds the energy difference between the sub-conduction band 512 and at least one of the first and second work functions 508, 510. However, the magnitude of the Vth does not exceed the energy difference between the conduction band 506 and at least one of the first and second work function 508, 510. As such, the on-current (Ion) will conduct through the selector layer 206 by conducting through the sub-conduction band 512 and not the conduction band 506.

Again, in this example, the polarity of the applied voltage is such that the first electrode 202 is more negative relative to the second electrode 204. Therefore, the threshold voltage Vth is applied across the first and second electrodes 202, 204 such that the first electrode voltage is negative relative to the second threshold voltage. As such, a magnitude of the negative threshold voltage Vth exceeds the energy difference between the sub-conduction band 512 and the first work function 508, but does not exceed the energy difference between the conduction band 506 and the first work function 508. As such, the on-current (Ion) will flow through the selector layer 206 from the first electrode 202 to the second electrode 204.

Though this example illustrates the threshold voltage Vth applied such that the first electrode 202 is more negative than the second electrode 204, the selector device may be designed to operate with the opposite polarity as well. That is, the Vth may be applied such that the first electrode 202 is more positive than the second electrode 204 to establish an Ion current in the opposite direction.

As shown in FIG. 5C (wherein the first electrode 202 is more negative than the second electrode 204), the band-gap 502 is bent substantially more relative to the band-gap 502 of FIG. 5B. As such, the energy level of the first work function 508 is elevated much closer to the sub-conduction band 512 in FIG. 5C than in FIG. 5B. Accordingly, electrons from the first electrode 202 have to overcome a much lower energy barrier between the first work function 508 and the sub-conduction band 512 to establish an on-current (Ion) through the selector layer 206.

At this point a variety of well-known conduction mechanisms may contribute to the Ion simultaneously. Such conduction mechanisms may be: tap-assisted tunneling, sub-band drift transport, Fowler-Nordheim tunneling, direct tunneling or the like. Regardless, the conduction mechanisms drive electrons from dopant atom to dopant atom within the sub-conduction band 512 created by those dopant atoms 214. However, there is comparatively insignificant current flow through the conduction band 506, because its energy level is still too high for the electrons from the first electrode 202 to overcome.

Moreover, the overall energy level of the sub-conduction band 512 is a composite of the many individual energy barriers between each dopant atom 214 that electrons in the sub-conduction band 512 must conduct through. As such, each energy barrier between dopant atoms 214 contributes to the Ion to Ioff ratio. As a result, the slope of the graph of voltage vs current (as best seen in FIG. 4) can be made much steeper than prior art selector devices and the ratio of Ion to Ioff can be made much larger. For example, the Ion to Ioff ratio may be equal to or greater than 1000, equal to or greater than 10,000, equal to or greater than 100,000 or more.

Figure 6:
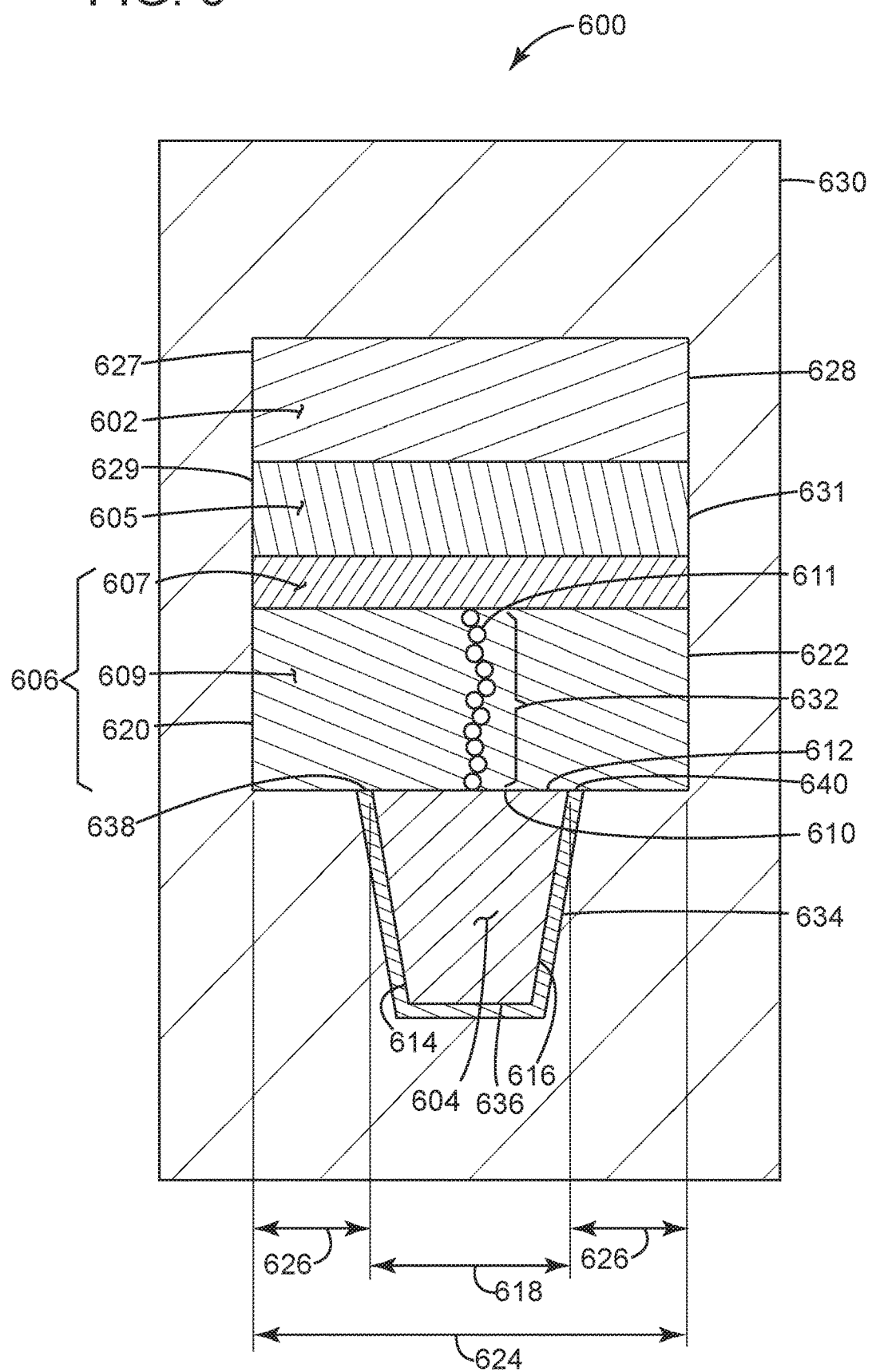
FIG. 6 depicts an example of a side view of a ReRAM device in accordance with aspects describe herein.

Referring to FIG. 6, an example of a side view of a ReRAM device 600 in accordance with aspects described herein is presented. The ReRAM device 600 is a type of resistive memory device that may be paired with a selector device (such as selector device 110 in FIGS. 1A and 1B and such as selector device 200 in FIG. 2) to form a memory cell 112 of an array 100 of memory cells (best seen in FIG. 1). Though the ReRAM device 600 is illustrated in detail in this example, other types of resistive memory devices may also be paired with selector device 200 to form a memory cell. For example, the resistive memory device may be a phase change random access memory (PRAM) device, a copper bridge random access memory (CBRAM) device or the like.

The ReRAM device 600 may be disposed within a semiconductor structure 630. The ReRAM device 600 includes a top electrode 602 and a bottom electrode 604 with a switching layer 606 therebetween. The bottom electrode 604 may be connected to contact studs (not shown) used to contact interconnect lines, such as the first interconnect lines 106 of array 100 (best seen in FIGS. 1A and 1B).

The ReRAM device 600 also includes an optional oxygen exchange layer (OEL) 605. The OEL 605 is disposed between the top electrode 602 and the switching layer 606. The OEL 605 is composed of a material designed to react with and oxidize an upper portion 607 of the switching layer 606. As a result, the upper portion 607 of switching layer 606 has a lower concentration of oxygen atoms than a lower portion 609 of the switching layer 606, due to the removal of such oxygen atoms by the OEL 605. Accordingly, the upper portion 607 of the switching layer 606 functions as a source of oxygen vacancies that may help in the formation of a filament 632.

The filament 632 is a defect in the switching layer 606 that is formed when a large enough electric field is applied across the top and bottom electrodes 602, 604. When the electric field is applied, the atomic bonds in the switching layer 606 begin to break apart (also referred to as dielectric breakdown). As such, oxygen atoms (not shown), which significantly contribute to the switching layer's 606 insulating properties, can be driven out of the switching layer 606, leaving behind additional oxygen vacancies 611. Each oxygen vacancy 611 contributes to at least 1 electron trap state within the switching layer 606, therefore increasing the conductivity and lowering the resistance of the switching layer 606.

As the oxygen vacancies 611 build up, a filament 632 of such vacancies may be formed across the width of the switching layer 606, which provides a conductive path for current to flow between the top and bottom electrodes 602, 604. Once the filament 632 is formed, it will remain in the switching layer 606 even when the electric field is removed.

Once most of the oxygen atoms have been driven out of the filament, the ReRAM device 600 is in a low resistive state (LRS). However, the oxygen atoms can be driven back into the filament 632 by applying another electric field that has the opposite polarity of the electric field that formed the filament. Therefore, the ReRAM device 600 can be switched back to a high resistive state (HRS). Additionally, the amount of oxygen atoms in the filament 632 can be regulated by an electric field's strength and polarity to provide any number of resistive states between the two extremes of the LRS and HRS. This gives the ReRAM device analog, as well as digital, characteristics.

The bottom electrode 604 has a top surface 610 in contact with a bottom surface 612 of the switching layer 606. The bottom electrode 604 also has a first sidewall 614 and second sidewall 616 that are spaced apart by a first distance 618 where the sidewalls 614, 616 contact the bottom surface 612 of the switching layer 606.

The bottom electrode 604 may be composed of a metal. In the example illustrated in FIG. 6, the metal may be tungsten. However, other metals may be used for the bottom electrode 604. For example, the bottom electrode 604 may be composed of copper, silver, titanium nitride, tantalum nitride or the like.

The switching layer 606 has a first sidewall 620 and second sidewall 622 that are spaced apart by a second distance 624 that is larger than the first distance 618. As such, the first sidewall 620 of the switching layer 606 overhangs the first sidewall 614 of the bottom electrode 604 by an overhang distance 626. Also the second sidewall 622 of the switching layer 606 overhangs the second sidewall 616 of the bottom electrode 604 by the predetermined overhang distance 626.

The top electrode 602 is disposed over the OEL 605 and the switching layer 606. The top electrode 602 also includes a first sidewall 627 and a second sidewall 628. Further, the OEL 605 includes a first sidewall 629 and a second sidewall 631. Due to manufacturing processes, the first and second sidewalls 627, 628 of the top electrode 602, as well as the first and second sidewalls 629, 631 of the OEL 605, may be substantially aligned with the first and second sidewalls 620, 622 of the switching layer 606 respectively.

The switching layer 606 may be composed of such dielectric materials as hafnium oxide, tantalum oxide, titanium oxide, niobium oxide or the like. It is also possible that the switching layer may be composed of a plurality of such dielectric materials. The switching layer may be formed with any thickness that is appropriate for the application. For example, the switching layer 606 may be composed of a thickness that is within a range of 2 to 20 nanometers.

The top and bottom electrodes 602, 604 may be composed of such metallic materials as tungsten, copper, aluminum, silver, titanium nitride, tantalum nitride or the like. It is also possible that the top and bottom electrodes 602, 604 may be composed of a plurality of such metallic materials. It is also possible that the top and bottom electrodes 602, 604 are composed of different materials. The top and bottom electrodes 602, 604 may be formed with any thickness that is appropriate for the application. For example, the top and bottom electrodes 602, 604 may be composed of a thickness that is within a range of 5 to 200 nanometers.

The OEL 605 is composed of a material designed to react with and oxidize the upper portion 607 of the switching layer

606. In this particular example, if the switching layer 606 is hafnium oxide (HfOx), then the OEL 605 may be titanium (Ti) in order to oxidize the upper portion 607 of the switching layer 606.

However, the OEL 605 may be composed of other materials as well. For example, the OEL 605 may be composed of hafnium, zirconium, titanium, tantalum, or the like.

The ReRAM may also include one or more liners 634 that prevent atoms in the bottom electrode 604 from drifting into and contaminating the adjacent material in the semiconductor structure 630. The one or more liners 634 are disposed over the first sidewall 614 and the second sidewall 616 of the bottom electrode 604. Additionally, the one or more liners 634 are also disposed over a bottom surface 636 of the bottom electrode 604. The first and second sidewalls 614, 616 and the bottom surface 636 form a portion of a perimeter of the bottom electrode 604 that is not in contact with the bottom surface 612 of the switching layer 606.

However, the one or more liners 634 have a first distal end 638 and second distal end 640 that are in contact with the bottom surface 612 of the switching layer 606. Advantageously though, the one or more liners 634 are composed of a material that does not react with the switching layer 606 when in contact with the switching layer 606. By way of example, if the switching layer 606 were composed of hafnium oxide, then the one or more liners 634 may be composed of TiN.

As such, the distal ends 638, 640 of the one or more liners will not oxidize that portion of the switching layer 606 they are in contact with. As a result, low oxygen regions, similar to the upper portion 607 of the switching layer 606, will not be inadvertently formed proximate the bottom surface 612 of the switching layer 606. As a result, the possibility of multiple filaments being formed will be greatly reduced. As such, the predictability of the switching behavior of the ReRAM device 600 will be significantly enhanced.

Though the one or more liners 634 are shown in this example as being composed of TiN, other materials may also be used. For example, the one or more liners 634 may be composed of titanium nitride, tantalum nitride, iridium, ruthenium or the like.

Also, even though the one or more liner 634 are illustrated in this example as being one liner, the one or more liners 634 may be a plurality of liners composed of a plurality of materials. The plurality of the one or more liners 634 would form a stack of liners, wherein each liner in the stack would be disposed over the sidewalls 614, 616 and bottom surface 636 of the bottom electrode 604. However, only the innermost liner of the stack would be in contact with (i.e., abut against) the sidewalls 614, 616 and bottom surface 636 of the bottom electrode 604.

The ReRAM device 600 includes the filament 632 of oxygen vacancies that form a controllable conductive path between the first and second electrodes 602, 604. During operation, by varying such characteristics as strength and duration of an applied electric field, oxygen atoms can be moved into and out of the filament 632 to control the conductivity of the ReRAM device 600 between the extremes of a high resistive state (HRS) and a low resistive state (LRS). During formation, the filament can statistically form anywhere between the first and second electrodes 602, 604.

Advantageously however, because the sidewalls 620, 622 of switching layer 606 overhang the sidewalls 614, 616 of the bottom electrode by a predetermined overhang distance 626, the filament 632 cannot form along the sidewalls 620, 622 of the switching material. Accordingly, the chances of the filament 632 failing to function properly due to inadvertent contact with other materials of semiconductor structure 630 that are located outside of switching layer 606 is greatly reduced.

The predetermined overhang distance 624 may take into consideration several parameters. Examples of such parameters include the tolerances of the alignment processes between the bottom electrode 604 and the switching layer 606, the degree of shrinkage of the bottom electrode 604 and switching layer 606 during various etching processes and the estimated size of the filament 632 to be formed.

Depending on such parameters, the first sidewall 620 of the switching layer 606 may be predetermined to overhang the first sidewall 614 of the bottom electrode 604 by an overhang distance 626 of 5 nanometers, 10 nanometers, 15 nanometers or more. Additionally, the second sidewall 622 of the switching layer 606 may be predetermined to overhang the second sidewall 616 of the bottom electrode 604 by the same overhang distance 626 of 5 nanometers, 10 nanometers, 15 nanometers or more. It is also possible that the two overhang distances 626, may be predetermined to be a different distance.

Figure 7:
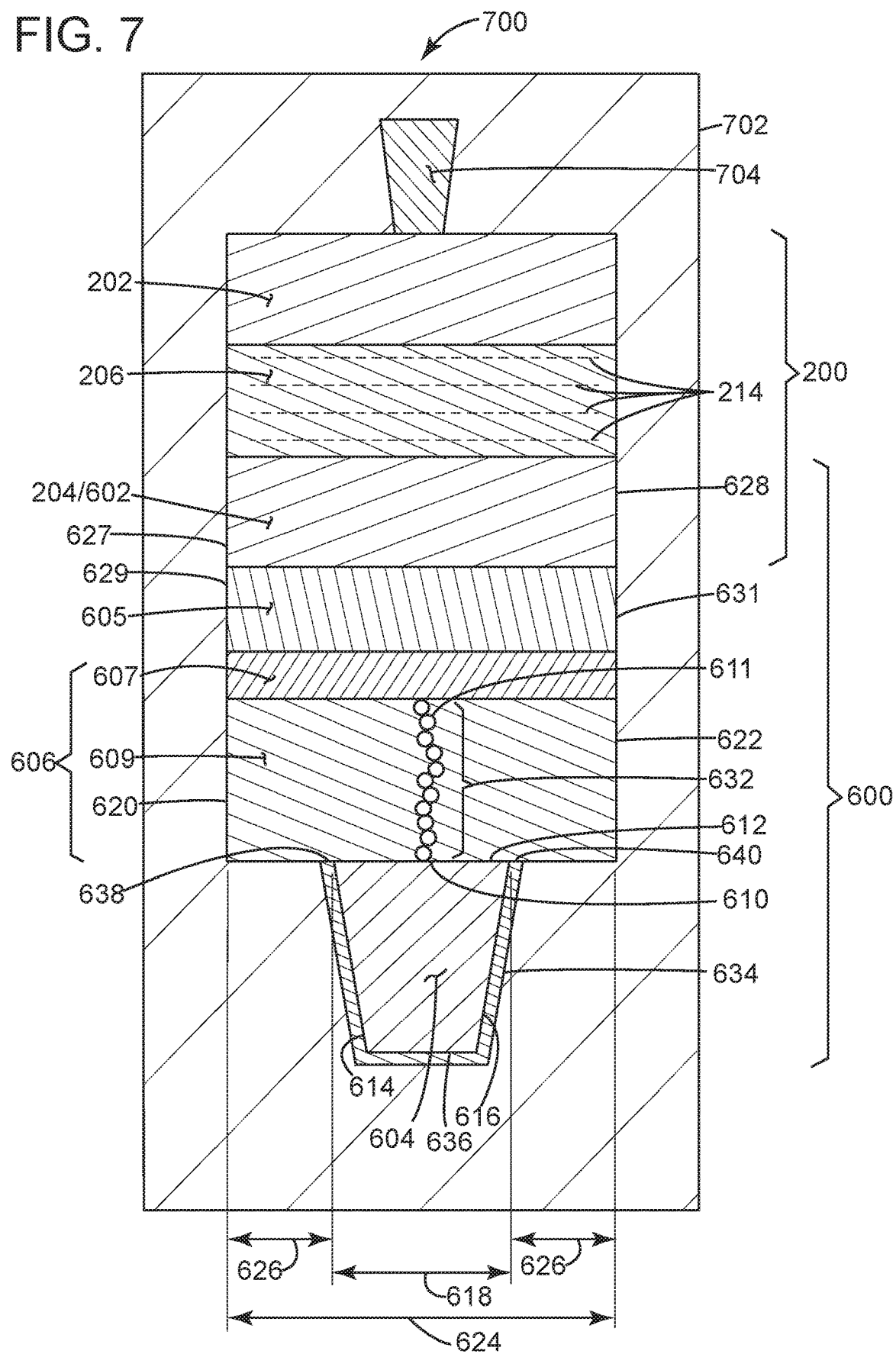
FIG. 7 depicts an example of a side view of a memory cell in accordance with aspects describe herein.

Referring to FIG. 7, an example of a side view of a memory cell 700 in accordance with aspects described herein is presented. The memory cell 700 is disposed within a semiconductor structure 702. The memory cell 700 includes a selector device that is disposed over and in electrical contact with a two terminal switching memory device. The selector device in this example is the selector device 200 as described with reference to FIG. 2 and wherein like features have like reference numbers. The two terminal switching memory device in this example is the ReRAM device 600 as described with reference to FIG. 6 and wherein like features have like reference numbers.

However, in this particular memory cell 700, the top electrode 602 of the ReRAM device 600 is the second electrode 204 of the selector device 200. That is, the same metal layer 204/602 can function as both the top electrode 602 of the ReRAM device 600 and the second electrode 204 of the selector device 200. That metal layer 204/602 may be composed of at least one of tungsten, copper, aluminum, silver, titanium nitride, tantalum nitride or the like.

In this example, a metal filled top contact via 704 is used to connect the first electrode 202 of the selector device 200 to interconnect lines, such as the second interconnect lines 108 of array 100 (best seen in FIGS. 1A and 1B). Additionally, the bottom electrode 604 of the ReRAM device 600 may be connected to contact studs (not shown) used to contact interconnect lines, such as the first interconnect lines 106 of array 100 (best seen in FIGS. 1A and 1B).

Though this memory cell 700 shows the second electrode 204 of the selector device 200 also functioning as the top electrode 602 of the ReRAM device 600, they may also be separate structures. For example, the second electrode 204 may be a separate structure from that of the top electrode 602, wherein the second electrode 204 of the selector device 200 is electrically connected to the top electrode 602 of the ReRAM device 600 by a metal filled via (not shown).

The ReRAM device 600 of the memory cell 700 may be designed to have an operating voltage (Vop). The selector device 200 of memory cell 700 may be designed to have a threshold voltage (Vth) which conducts an on-current (Ion) and a half threshold voltage (Vth/2) which conducts an off-current Ioff that is several orders of magnitude below the Ion. The Vth will be designed to be below the Vop and the Vth/2may be designed to be above Vop/3.

Figure 8B:
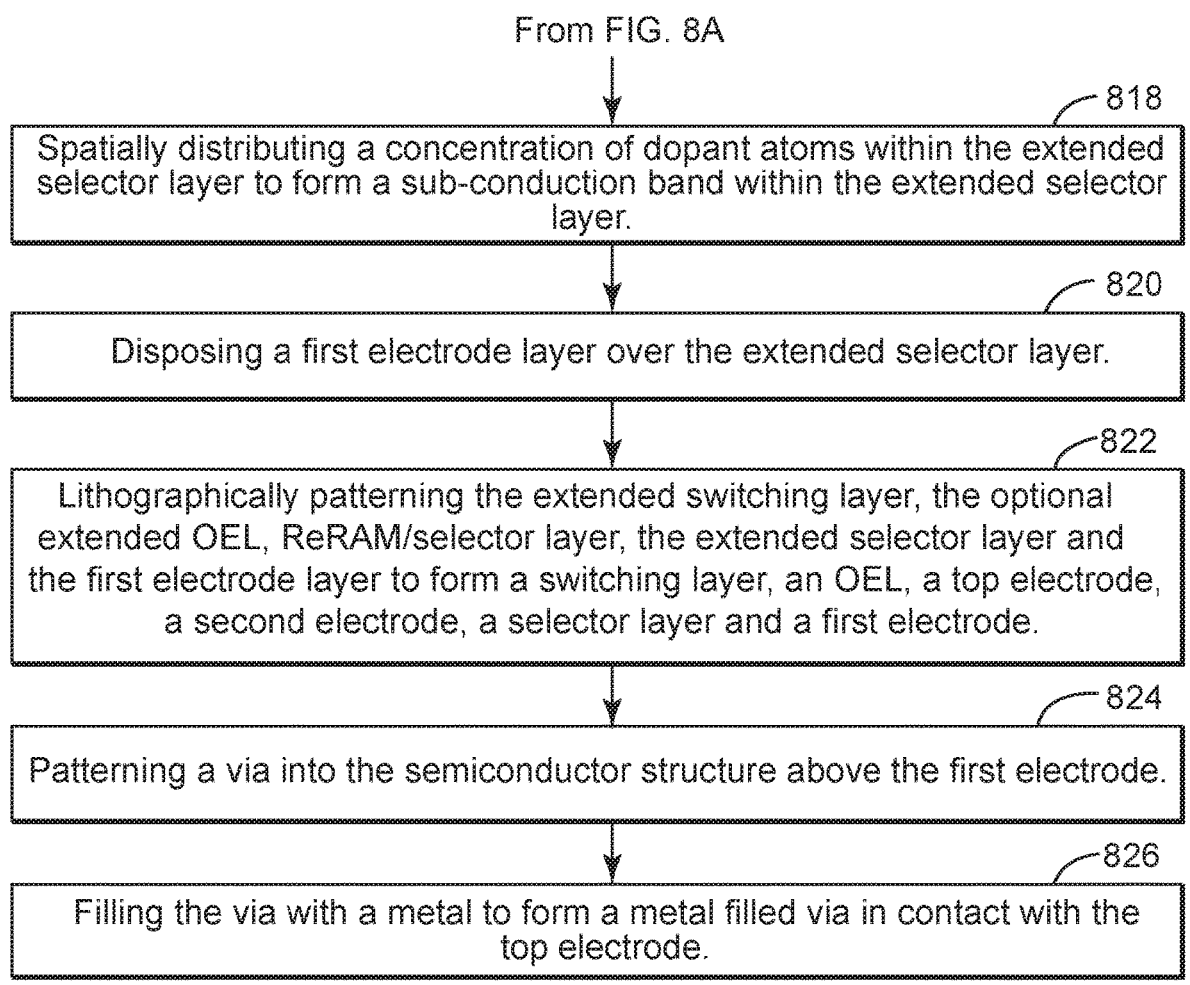
FIG. 8B depicts an example of a second portion of the process flow diagram of FIG. 8A according to aspects described herein.

Referring to FIGS. 8A and 8B, an example of a first (FIG. 8A) and a second (FIG. 8B) portion of a process flow diagram of a method 800 of making a memory cell according to aspects described herein is presented. In this example, the method 800 may be utilized to manufacture memory cell 700. However, other memory cells (such as, for example a memory cell using other two terminal resistive memory devices, such as a PRAM or a CBRAM) may also be formed using variations of method 800.

The method begins at 802, where a bottom electrode hole is patterned and etched into a dielectric material of the semiconductor structure 702. The patterning may be done by well-known lithographic patterning techniques. The etching may be by an anisotropic method such as by a reactive ion etching (RIE) process.

The method then proceeds to 804, wherein one or more liners 634 are disposed within the hole. The one or more liners 634 are each composed of a material that does not react with material of a yet to be disposed extended switching layer when in contact with the extended switching layer. The one or more liners may be disposed within the hole using such deposition techniques as atomic layer deposition (ALD), chemical vapor deposition (CVD), physical vapor deposition (PVD), sputtering, evaporation or the like. The one or more liner material may be titanium nitride (TiN), tantalum nitride (TaN), iridium (Ir), ruthenium (Ru) or the like.

The method then proceeds to 806, wherein the hole is filled with a bottom electrode material. The hole may be filled using such deposition techniques as sputtering, electro-plating, CVD, PVD, evaporation or the like. The bottom electrode material may be W, Co, Cu, TiN or the like.

The method then proceeds to 808, wherein excess bottom electrode material is planarized to form the bottom electrode 604. The bottom electrode 604 has first and second sidewalls 614, 616 that are separated at the top surface 610 of the bottom electrode 604 by a first distance 618. The bottom electrode material may be planarized using chemical mechanical planarization (CMP) or other similar techniques.

The method then proceeds to 810, wherein an extended switching layer is disposed over the bottom electrode 604. The extended switching layer, as used herein, is a layer that is disposed over the semiconductor structure 702 during the process flow of this method 800. A significant portion of the extended switching layer will be lithographically patterned down (herein at 822 of this method 800) to form the switching layer 606 as shown in FIG. 7. The extended switching layer may be disposed by such techniques as ALD, CVD, PVD or the like. The extended switching layer may be composed of material such as HfOx, Ti, TiN or the like.

The method then proceeds to 812, wherein an optional extended oxygen exchange layer (OEL) is disposed over the extended switching layer. The extended OEL, as used herein, is a layer that is disposed over the semiconductor structure 702 during the process flow of this method 800. A significant portion of the extended OEL will be lithographically patterned down (herein at 822 of this method 800) to form the OEL 605 as shown in FIG. 7. The extended OEL may be disposed by such techniques as ALD, CVD, PVD or the like. The extended OEL may be composed of material such as Ti, Zr, Hf, Nb, Ta or the like.

The method then proceeds to 814, wherein a ReRAM/selector layer is disposed over the extended switching layer and the optional extended OEL. The ReRAM/selector layer, as used herein, is a layer that is disposed over the semiconductor structure 702 during the process flow of this method 800. A significant portion of the ReRAM/selector layer will be lithographically patterned down (herein at 822 of this method 800) to form the metal layer 204/602 that functions as both the top electrode 602 of the ReRAM device 600 and the second electrode 204 of the selector device 200 as shown in FIG. 7. Also, the ReRAM/selector layer may include more than one layer if the top electrode 602 and second electrode 204 were to be formed as two separate and distinct structures. The ReRAM/selector layer may be disposed by such techniques as ALD, CVD, PVD or the like. The ReRAM layer may be composed of material such as TaN, Ir, Ru, W, TiN or the like. The ReRAM/selector layer will be formed into and function as the top electrode 602 of the ReRAM device 600 and the second electrode 204 of the selector device 200. The ReRAM/selector layer has a first work function.

The method then proceeds to 816, wherein an extended selector layer is disposed over the ReRAM/selector layer. The extended selector layer, as used herein, is a layer that is disposed over the semiconductor structure 702 during the process flow of this method 800. A significant portion of the extended selector layer will be lithographically patterned down (herein at 822 of this method 800) to form the selector layer 206 as shown in FIG. 7. The extended selector layer may be disposed using such techniques as ALD, CVD, PVD or the like. The extended selector layer may be composed of aluminum oxide, silicon oxide, magnesium oxide or the like. The extended selector layer has a conduction band and a valence band defining a band-gap of at least 5.0 electron volts.

The method then proceeds to 818, wherein a concentration of dopant atoms are spatially distributed throughout the extended selector layer to form a sub-conduction band within the extended selector layer. The sub-conduction band is below the conduction band and above the first work function of the ReRAM/selector layer.

The method then proceeds to 820, wherein a first electrode layer is disposed over the extended selector layer. The first electrode layer, as used herein, is a layer that is disposed over the semiconductor structure 702 during the process flow of this method 800. A significant portion of the first electrode layer will be lithographically patterned down (herein at 822 of this method 800) to form the first electrode 202 as shown in FIG. 7. The first electrode layer may be disposed by such techniques as ALD, CVD, PVD or the like. The first electrode layer may be composed of material such as TaN, Ir, Ru, W, TiN or the like. The first electrode layer has a second work function that is below the sub-conduction band.

The method then proceeds to 822, wherein the extended switching layer, the optional extended OEL, the ReRAM/selector layer, the extended selector layer and the first electrode layer are lithographically patterned to form the switching layer 606, the OEL 605, the top electrode 602, the second electrode 204, the selector layer 206 and the first electrode 202. The switching layer 606 is patterned such that it has first and second sidewalls 620, 622 that are separated by a second distance 624, wherein the second distance 624 is greater than the first distance 618. The switching layer 606 is also patterned such that first sidewall 620 of the switching layer 606 overhangs the first sidewall 614 of the bottom electrode 604 by at least an overhang distance of 626. The switching layer 606 is also patterned such that second sidewall 622 of the switching layer 606 overhangs the second sidewall 616 of the bottom electrode 604 by at least the overhang distance of 626.

The stack of the extended switching layer, extended OEL, ReRAM/selector layer, extended selector layer, and first electrode layer may be patterned by first coating the stack with photoresist material and then using photolithographic techniques to form a pattern in the photoresist material. The pattern may then be etched down through the stack to form the switching layer 606, OEL 605, top electrode 602, second electrode 204, selector layer 206 and first electrode 202. The etching may be an anisotropic etch, such as a RIE process, to position the switching layer 606 over the bottom electrode 604 and to align the sidewalls of the switching layer 606 with the sidewalls of the OEL 605, top electrode 602 of the ReRAM device 200 (which is the same as the second electrode 204 of the selector device 200), selector layer 206 and first electrode 202.

The method then proceeds with a $Si_3N_4$ encapsulation of the patterned ReRAM and selector device structures, and a deposition of $SiO^2$ for the V1/M2 metallization layer. Followed by 824, wherein a via is patterned above the first electrode 202. The via may be formed using photolithographic RIE techniques as described earlier.

The method then proceeds to 826, wherein the via is filled with a metal to form the metal filled via 704 in electrical contact with the first electrode 202. The metal that fills the via may be Al, Cu or the like. The via may be filled using such techniques as sputtering, CVD, PVD, ALD, electroplating or the like.

It should be appreciated that all combinations of the foregoing concepts and additional concepts discussed in greater detail herein (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

Although the invention has been described by reference to specific examples, it should be understood that numerous changes may be made within the spirit and scope of the inventive concepts described. Accordingly, it is intended that the disclosure not be limited to the described examples, but that it have the full scope defined by the language of the following claims.

What is claimed is:

1. A selector device comprising:
a first electrode composed of a first metal having a first work function;
a second electrode composed of a second metal having a second work function;
a selector layer disposed between the first and second electrodes, the selector layer being composed of a dielectric material having a conduction band and a valence band defining a band gap of at least 5 electron volts and below 9.2 electron volts; and
dopant atoms disposed in the selector layer to form a sub-conduction band that is below the conduction band and above the first and second work functions;
wherein when a threshold voltage is applied across the first and second electrodes, and a magnitude of the threshold voltage exceeds an energy difference between the sub-conduction band and at least one of the work functions, but does not exceed an energy difference between the conduction band and the at least one of the work functions, an on-current will conduct through the selector layer.

2. The selector device of claim 1 wherein when a half-threshold voltage that is half the threshold voltage or less is applied across the first and second electrodes, an off-current will conduct through the selector layer, a ratio of the on-current to off-current being 1000 or more.

3. The selector device of claim 2 wherein the ratio of on-current to off-current is 10,000 or more.

4. The selector device of claim 1 wherein the on-current will conduct through the selector layer as electrons pass from one dopant atom to another dopant atom by one of a trap-assisted tunneling mechanism, a hopping conduction mechanism, a Fowler Nordheim conduction mechanism and a sub-band drift transport mechanism.

5. The selector device of claim 1 wherein the selector layer is composed of at least one of aluminum oxide and magnesium oxide, wherein the at least one of aluminum oxide and magnesium oxide are optionally combined with silicon oxide.

6. The selector device of claim 1 wherein the dopant atoms are at least one of magnesium and vanadium, wherein the at least one of magnesium and vanadium are optionally combined with titanium.

7. The selector device of claim 1 wherein the sub-conduction band is in a range of 0.2 to 1.5 eV above the electrode work functions.

8. The selector device of claim 1 wherein the first metal of the first electrode and the second metal of the second electrode are each selected from at least one of tungsten, iridium, platinum, titanium nitride, tantalum nitride.

9. The selector device of claim 1 wherein the selector layer has a thickness that is within a range of 2 to 20 nanometers.

10. The selector device of claim 1 wherein the first and second electrodes have a thickness that are within a range of 5 to 200 nanometers.

11. The selector device of claim 1 wherein:
when the threshold voltage is applied across the first and second electrodes such that the first electrode voltage is negative relative to the second threshold voltage; and
when the threshold voltage exceeds an energy difference between the sub-conduction band and the first work function, but does not exceed an energy difference between the conduction band and the first work function; the on-current will conduct through the selector layer.

12. A memory cell comprising:
a two terminal resistive switching device comprising:
a switching layer having a first sidewall and a second sidewall;
a bottom electrode having a first sidewall, a second sidewall, a bottom surface, and a top surface in contact with the switching layer, wherein the switching layer overhangs the first sidewall of the bottom electrode by an overhang distance and the switching layer overhangs the second sidewall of the bottom electrode by an overhang distance; and
a top electrode disposed over the switching layer;
a selector device disposed on the two terminal resistive switching device, the selector device comprising:
a first electrode composed of a first metal having a first work function;
a second electrode composed of a second metal having a second work function;
a selector layer disposed between the first and second electrodes, the selector layer being composed of a dielectric material having a conduction band and a valence band defining a band gap of at least 5 electron volts (eV); and dopant atoms disposed in the selector layer to form a sub-conduction band that is below the conduction band and above the first and second work functions.

13. The memory cell of claim 12 wherein the top electrode of the two terminal resistive switching device is the second electrode of the selector device.

14. The memory cell of claim 12 wherein the two terminal resistive switching device comprises:
one or more liners disposed over a first sidewall, a second sidewall, and a bottom surface of the bottom electrode, the one or more liners having first and second distal ends that are in contact with a bottom surface of the switching layer.

15. The memory cell of claim 12 wherein when a half-threshold voltage that is half threshold voltage or less is applied across the first and second electrodes, an off-current will conduct through the selector layer, the ratio of on-current to off-current being 1000 or more.

16. The memory cell of claim 12 wherein a on-current will conduct through the sub-conduction band of the selector layer as electrons pass from one dopant atom to another dopant atom by one of a trap-assisted tunneling mechanism, a hopping conduction mechanism, a Fowler Nordheim conduction mechanism and a sub-band drift transport mechanism.

17. The memory cell of claim 12 wherein:
the selector layer is composed of at least one of aluminum oxide and magnesium oxide, wherein the at least one of aluminum oxide and magnesium oxide are optionally combined with silicon oxide; and
the dopant atoms are at least one of magnesium and vanadium, wherein the at least one of magnesium and vanadium are optionally combined with titanium.

18. The memory cell of claim 12 wherein:
a threshold voltage of the selector device is less than an operating voltage of the two terminal resistive switching device; and
half the threshold voltage of the selector device is more than a third of the operating voltage of the two terminal resistive switching device.

19. The memory cell of claim 12, wherein the bottom electrode is a trapezoidal structure.

* * * * *